United States Patent [19]

Spies

[11] Patent Number: 4,595,991
[45] Date of Patent: Jun. 17, 1986

[54] POSITION MEASURING METHOD AND APPARATUS

[75] Inventor: Alfons Spies, Seebruck, Fed. Rep. of Germany

[73] Assignee: Dr. Johannes Heidenhain GmbH, Traunreut, Fed. Rep. of Germany

[21] Appl. No.: 534,368

[22] Filed: Sep. 21, 1983

[30] Foreign Application Priority Data

Oct. 22, 1982 [DE] Fed. Rep. of Germany ....... 3239108

[51] Int. Cl.⁴ .............................................. G01C 3/08
[52] U.S. Cl. ........................................ 364/525; 356/4; 364/559; 33/1 L
[58] Field of Search ........................ 364/525, 561, 562; 356/4, 4.5; 354/400, 402, 404; 33/1 L

[56] References Cited

U.S. PATENT DOCUMENTS 3,244,063 4/1966 Lawrence ............................. 33/1 L
3,523,731 8/1970 Mary ...................................... 356/4
3,674,372 7/1972 Weyrauch .
3,932,745 1/1976 Hartman ................................. 356/4
3,951,548 4/1976 Westell .................................. 356/4
4,173,402 11/1979 Horike et al. ......................... 356/4
4,225,931 9/1980 Schwefel .
4,283,137 8/1981 Tsunekawa et al. .................. 356/4
4,334,150 6/1982 Herbst et al. ......................... 356/4

FOREIGN PATENT DOCUMENTS 2357372 7/1974 Fed. Rep. of Germany .

Primary Examiner—Parshotam S. Lall
Attorney, Agent, or Firm—Willian Brinks Olds Hofer Gilson & Lione Ltd.

[57] ABSTRACT

A process and apparatus for obtaining harmonic-free periodic signals in an incremental measuring system is disclosed in which a graduation having a graduation period P is scanned by at least six scanning elements (for the case in which the previously determined bandwidth N of the analog signals obtained in scanning the graduation N is equal to 3). The periodic analog signals generated by the scanning elements are subjected to a Fourier analysis for the determination of the Fourier coefficients of the base or fundamental wave of the periodic analog signals. These Fourier coefficients are then evaluated as harmonic-free periodic signals for the formation of position measuring values.

13 Claims, 8 Drawing Figures

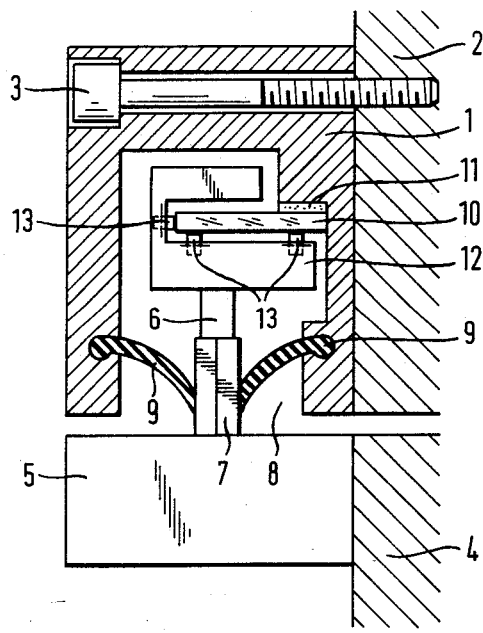

POSITION MEASURING METHOD AND APPARATUS

BACKGROUND OF THE INVENTION

The present invention relates to a method and apparatus for obtaining substantially harmonic free periodic signals in an incremental or absolute measuring system.

A variety of photoelectric, magnetic, inductive and capacitive measuring systems are known to the art for measuring the relative position of two objects, such as the relative position between a slide piece and a bed of a machine tool for example.

In the case of prior art photoelectric length measuring systems, a measuring scale which defines a periodic graduation is mounted to a first object, and this scale is scanned by a scanning unit which is connected with a second object. The scanning unit includes for this purpose an illuminating system, and a scanning plate which may, for example, include two graduation fields. The graduations of these fields are typically offset with respect to one another by a phase angle of 90° and correspond precisely in period with the graduation of the measuring scale. In addition, the scanning unit includes, for example, two photosensors, each of which is associated with a respective one of the graduation fields.

In the case of transmitted light measuring systems, the similar graduations on the scanning plate and the measuring scale are made up of alternating photopermeable and photoimpermeable strips which alternate along the longitudinal extent of the measuring scale (the measuring direction). The light flux generated by the illumination system passes through the graduations of the measuring scale and the scanning plate and then falls upon the photosensors. Thus, the light falling on the photosensors is modulated by the relative movement of the scanning plate with respect to the measuring scale. The two photosensors associated with respective ones of the graduation fields generate two periodic electric analog signals which are phase shifted with respect to one another by a phase angle of 90° and are sinusoidal in wave form. These sinusoidal analog signals are applied as inputs to an evaluating arrangement which determines the measured position value from the analog signals. The period of the analog signals generated by the scanning unit is determined by the period of the graduation of the measuring scale. This period is in turn determined by the width of the alternating photopermeable and photoimpermeable strips along the measuring direction. In relative movement between the scanning unit and the measuring scale, each period of the graduation of the measuring scale results in the generation of a counting pulse which is counted and displayed.

In general, the periodic analog signals obtained from the graduations of a measuring scale in photoelectric, magnetic, inductive, and capacitive measuring systems are not precisely sinusoidal in wave form. Rather, in general such periodic analog signals include harmonic components as a consequence of inaccuracies in the graduations. Such inaccuracies can result, for example, from differing spacings between the photopermeable and the photoimpermeable strips of the graduations, or by an edge blurring of these strips.

One prior art approach to minimize the harmonic components in the analog scanning signal is to place high precision demands on the accuracy of the graduation. If the periodic analog signals are to be used to form exact position measuring values for each graduation period, and to provide improved measuring precision by subdividing the graduation periods of the graduation through the formation of interpolation values, the analog signals obtained from the graduation must be substantially free of harmonics. The prior art discloses several approaches to the formation of such interpolation values, such as the computer based approach described in West German DE-OS No. 27 29 697.

In addition to the measuring systems described above, other classes of prior art measuring systems generate triangular or trapezoidal analog measuring signals, which by their very nature include a large harmonic component.

German Pat. No. DE-PS 19 41 731 discloses a photoelectric length measuring system in which harmonic components in the analog signal generated in the scanning of the graduation of the measuring scale are reduced by means of a frequency filter diaphragm having a sinusoidal permeability characteristic. In this measuring system it is necessary for a special frequency filter diaphragm to be produced and installed on the measuring system. Moreover, this approach to the reduction of harmonic components is restricted to use in photoelectric measuring systems which operate according to the transmitted light measuring principle.

SUMMARY OF THE INVENTION

The present invention is directed to an improved measuring system which provides substantially harmonic-free periodic signals in a measuring system without the need for special optical elements, and which is widely applicable through a broad range of types of measuring instruments.

According to this invention, a position measuring system, of the type comprising a measuring scale which comprises a periodic graduation and a scanning unit adapted to scan the measuring scale, is provided with at least 2N scanning elements. Each of the scanning elements is included in the scanning unit to scan the periodic graduation and to generate a respective periodic scanning signal in response thereto. The number of scanning elements is selected at twice the bandwidth N of the scanning signals generated by the scanning elements. Means are provided for performing a Fourier analysis on the scanning signals to determine a pair of Fourier coefficients characteristics of the fundamental component of the scanning signals. These Fourier coefficients are evaluated as substantially harmonic-free periodic signals to determine the position of the scanning unit with respect to the measuring scale.

This invention is also directed to a method for generating harmonic-free periodic signals in an incremental or absolute measuring system comprising a scale which defines a graduation having a period P and a scanning unit which scans the scale to generate scanning signals. The first step in this method is to determine the bandwidth N characteristic of the scanning signals. Then, at least 2N scanning elements are provided in the scanning unit to scan the graduation, and each of the scanning elements generates a respective scanning signal $S_n$ in response thereto. A Fourier analysis is then performed on the scanning signals to determine a pair of Fourier coefficients characteristic of a lowest frequency Fourier component of the scanning signals. Then, the Fourier coefficients are evaluated as harmonic free periodic signals to determine the position of the scanning unit with respect to the scale.

The present invention provides important advantages in terms of a simple system which generates substantially harmonic free periodic signals and which is readily adapted for use with known position measuring systems. No additional elements such as frequency filter diaphragms or the like are required to implement this invention, and it allows reduced demands to be placed upon the accuracy of the graduation of the measuring scale. For this reason, the present invention can be used to provide a particularly economical, conventionally constructed measuring apparatus which generates substantially harmonic-free periodic signals. Because no additional optical elements such as frequency filter diaphragms are required, problems related to shipping and storing additional components are simplified. Further advantageous features are set forth in the dependent claims attached hereto.

The invention itself, together with further objects and attendant advantages, will best be understood by reference to the following detailed description, taken in conjunction with the accompanying drawings.

BRIEF DESCRIPTION OF THE DRAWINGS

FIG. 1 is a cross-sectional view of a length measuring system suitable for use with this invention.

FIG. 2 is a schematic representation of a portion of a scanning unit included in the length measuring instrument of FIG. 1.

FIG. 3b is a schematic representation of portions of a scanning unit suitable for use with a first preferred embodiment of this invention which operates with a measuring scale having a sinusoidally varying magnetic field as shown in FIG. 3a.

DETAILED DESCRIPTION OF THE PRESENTLY PREFERRED EMBODIMENTS

Figure 3A:
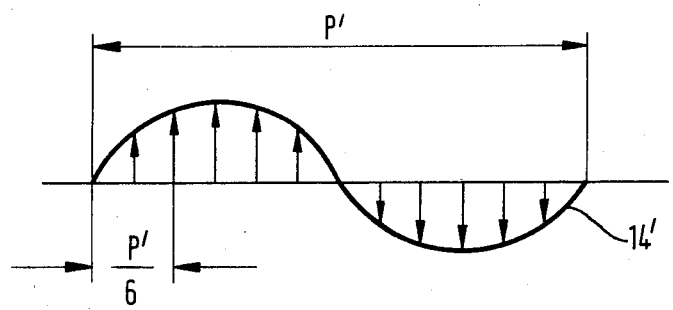
FIG. 3a is a wave form diagram showing the variation in magnetic field strength in a magnetic measuring scale suitable for use with this invention.

Turning now to the drawings, FIG. 1 shows a cross-sectional view of a length measuring system which includes a housing 1 which is formed as a hollow profile and is fastened to a bed 2 of a processing machine (not shown) by means of a screw connection 3. This processing machine includes a slide piece 4 to which is fastened in an arbitrary manner an assembly base 5. The assembly base 5 serves to mount a follower 6 which defines a sword shaped tapered portion 7 which extends through a slit 8 defined in the otherwise completely enclosed housing 1. Elastic sealing lips 9 are mounted on the housing 1 so as to close the slit 8 around the tapered section 7, thereby preventing the penetration of contaminants into the interior of the housing 1. A measuring scale 10 is mounted on an inner surface of the housing 1 by means of an elastic adhesive layer 11. A scanning unit 12 is secured to the follower 6 and is guided for motion along the measuring scale 10 by means of rollers 13. Relative movement between the slide piece 4 and the bed 2 is transferred by the follower 6 to the scanning unit 12.

As shown in FIG. 2, the scanning unit 12 operates to scan a graduation 14 defined by the measuring scale 10. For this purpose, the scanning unit 12 includes a light source 15, a condensor lens 16, a scanning plate 17 and a photosensor 19. The scanning plate 17 defines a scanning graduation 18, which is identical with the graduation 14 of the measuring scale 10. The light beam generated by the light source 15 is collimated by the condensor lens 16, passes through the graduations 14,18 of the scale 10 and the scanning plate 17, and then falls on the photosensor 19.

As the scanning unit 12 and the measuring plate 17 move along the measuring direction x with respect to the measuring scale 10, light falling on the photosensor 19 is modulated by means of the relative movement between the graduations 14,18. For this reason, the photosensor 19 generates a periodic electric analog signal S(x). This analog signal S(x) is evaluated, counted and displayed in digital form by the measuring system in order to determine a measured position value characteristic of the position of the scanning unit 12 with respect to the measuring scale 10.

In general, the periodic analog signal S(x) generated by the photosensor 19 includes harmonic components, as for example due to inaccuracies of the graduations 14,18. This analog signal S(x) can be represented in general as a function of the position along the measuring direction x by a Fourier series as follows:

$$S(x) = a_0/2 + \sum_{k=1}^{N} (a_k \cos kx + b_k \sin kx). \quad \text{(Eq 1)}$$

The running summation index k is the order number of the waves or frequencies. Thus, for example, the base or fundamental wave component corresponds to k=1, the first harmonic component corresponds to k=2, and so forth. In Eq 1, $a_k$ and $b_k$ are the Fourier coefficients.

According to this invention, harmonic-free periodic signals are obtained by first determining the bandwidth N (number of frequencies or waves) of the analog signal S(x). The graduation 14 (having a division period P) is then scanned with at least 2N scanning elements $T_1$-$T_{2N}$. The resulting periodic analog signals $S_1$-$S_{2N}$ generated by the scanning elements $T_1$-$T_{2N}$ are then subjected to a Fourier analysis in order to determine the Fourier coefficients of the lowest frequency component of the analog signal S(x). The Fourier coefficients $a_1,b_1$ are then evaluated as harmonic-free periodic signals in order to determine the measured position value.

In order to determine the bandwidth N (the number of Fourier components with nonvanishing Fourier coefficients $a_k,b_k$) characteristic of the analog signal S(x) generated with the graduation 14, the graduation 14 is scanned, for example by a scanning element with reference to a reference measuring system. The resulting analog signal S(x) obtained in this manner is subjected to a computational Fourier analysis. In the case of a series of identical graduations, the band width N need be determined only once.

The criterion for determining the minimum magnitude of a "nonvanishing" Fourier coefficient will depend upon the application. In general, it depends upon the desired interpolation factor, and the greater the interpolation factor, the smaller the Fourier coefficient which must be taken into account. In the case of 100 fold interpolation within a graduation period P, it may be desirable to take into account the first five harmonics (N=6). In each case, the bandwidth N is selected as appropriate for the particular graduation and the intended interpolation factor.

Figure 3B:
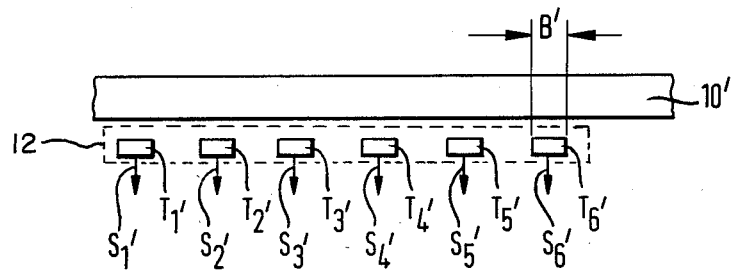

FIG. 3b shows a measuring scale 10' formed of a magnetizable material. This scale 10' defines a magnetic graduation 14' with a graduation period P', as shown in FIG. 3a. In FIG. 3a, the vertical arrows indicate the strength and polarity of the magnetic field of the magnetic graduation 14'. For purposes of illustration, it will be assumed that the analog signal S' has a bandwidth N equal to 3. According to this invention, therefore, six equidistant scanning elements $T_1'-T_6'$ are used to scan the graduation period P'. The individual scanning elements $T_1'-T_6'$ (which in this embodiment take the form of schematically represented Hall elements) generate periodic analog signals $S_1'-S_6'$ in the scanning of the graduation 14'. According to this invention these periodic analog signals $S_1'-S_6'$ are subjected to a Fourier analysis. In this embodiment, the scanning elements $T_1'-T_6'$ are arranged at a spacing with respect to one another of $P'/6+zP'$ (z=0, 1, 2, ...). In this embodiment, each of the scanning elements $T_1'-T_6'$ defines a width B' along the measuring direction which is less than P'/6.

Figure 4:
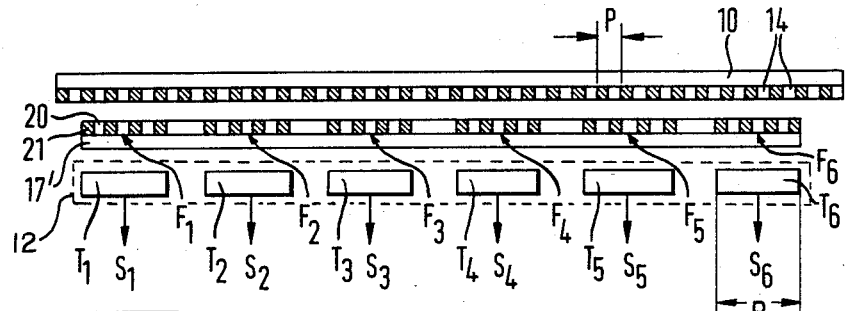
FIG. 4 is a schematic representation of portions of a scanning unit suitable for use with a second preferred embodiment of this invention.

FIG. 4 shows the scale 10 of FIG. 2 and the graduation 14 having graduation period P. For purposes of discussion it will be assumed that the analog signal S obtained from the graduation 14 has a bandwidth N=3. According to this invention, therefore, six scanning elements $T_1-T_6$ are arranged in the scanning unit 12 at spacings with respect to one another along the measuring direction x equal to $B+zP+P/6$ (z=0, 1, 2, ...). In this embodiment, the width B of the scanning elements $T_1-T_6$ is greater than the graduation period P. Each of the scanning elements $T_1-T_6$ comprises a respective photosensor which is allocated to a respective graduation field $F_1-F_6$ defined by the scanning plate 17'. These graduation fields are likewise arranged at spacings of $B+zP+P/6$ with respect to one another. According to this invention, the analog signals $S_1-S_6$ generated by the scanning elements $T_1-T_6$ during the scanning of the graduation 14 are subjected to a Fourier analysis. The graduations of the graduation fields $F_1-F_6$ also are characterized by a graduation period equal to the graduation period P of the graduation 14. The graduations of the graduation fields $F_1-F_6$ are made up of alternating photopermeable active strips or zones 20 and photoimpermeable passive strips or zones 21. Both the strips 20 and the strips 21 are characterized by a width equal to P/2.

Figure 5:
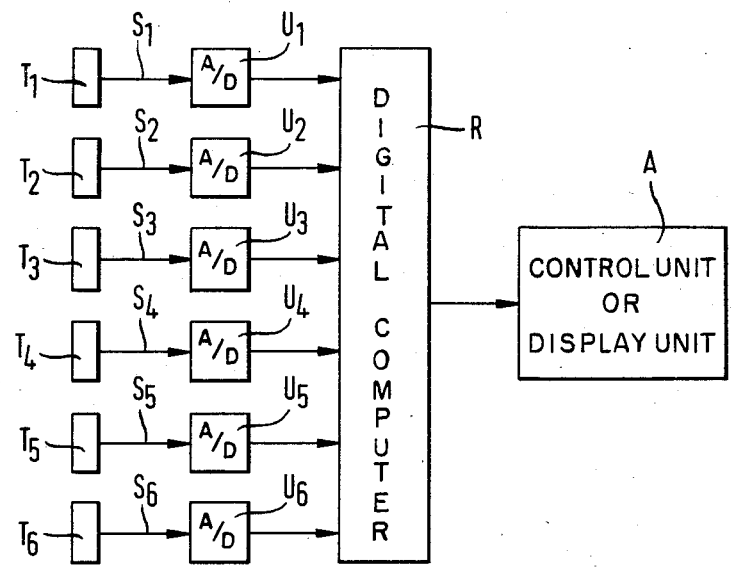
FIG. 5 is a schematic representation of a digital evaluating circuit suitable for use with the scanning units of either FIG. 3b or FIG. 4.

FIG. 5 shows a digital evaluation circuit for evaluating the scanning signals $S_1-S_6$ in accordance with this invention. As shown in FIG. 5, the analog scanning signals $S_1-S_6$ generated by the scanning elements $T_1-T_6$ are digitized by means of respective analog to digital converters $U_1-U_6$. The digitized analog signals are then fed into a digital computer R which determines the Fourier coefficients $a_1, b_1$ of the lowest frequency Fourier component (k=1) for use as harmonic-free periodic signals according to the following equations:

$$a_1 = 1/N \sum_{n=1}^{2N} S_n \cos \pi (n-1)/N; \quad \text{(Eq 2)}$$

$$= \tfrac{1}{3} \sum_{n=1}^{6} S_n \cos \pi (n-1)/3;$$

$$b_1 = 1/N \sum_{n=1}^{2N} S_n \sin \pi (n-1)/N;$$

$$= \tfrac{1}{3} \sum_{n=1}^{6} S_n \sin \pi (n-1)/3.$$

The computer R then determines a phase angle $\phi = \arctan a_1/b_1$. This phase angle $\phi$ represents a measure of the absolute position of the scanning unit 12 within a graduation period P of the graduation 14. From the phase angle $\phi$ the absolute measured position value x is determined according to the equation $x = \phi \cdot P/2\pi$. In this formula the measured value x represents the absolute position of the scanning unit 12 within a graduation period P. The measured values x are applied to a control and/or display unit A for the control of a machine and/or for digital display. If the scanning unit 12 moves over several graduation periods P then the computer determines whether the phase angle $\phi$ jumps from $2\pi$ to 0 or from 0 to $2\pi$. The counter state in the unit A is raised or lowered during such transition in each case by the unit of the graduation P. In this way a continuous determination of the relative position of the two objects 2,4 over multiple graduation periods P is made possible.

Figure 6:
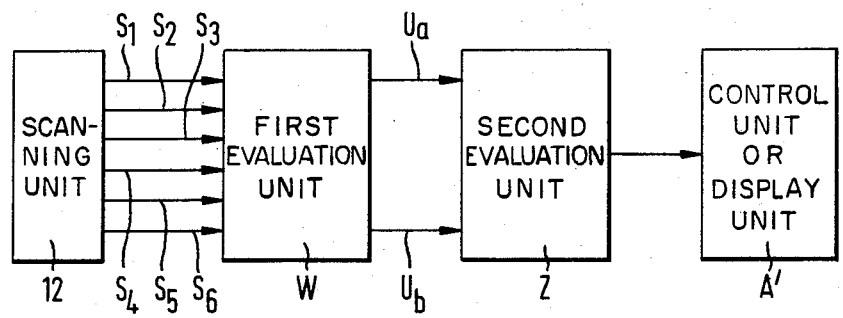
FIG. 6 is a schematic representation of an analog evaluating circuit suitable for use with the scanning units of either FIG. 3b or FIG. 4.

FIG. 6 shows a second preferred embodiment which can be used to implement this invention. As shown in FIG. 6 the periodic analog signals $S_1-S_6$ generated by the scanning elements $T_1-T_6$ are transmitted from the scanning unit 12 to an evaluating arrangement W for the determination of the Fourier coefficients $U_a, U_b$ as described below. These Fourier coefficients are thereupon conducted to an evaluating arrangement Z for the formation of position measuring values as described above. This evaluating arrangement Z consists of a direction discriminator for the determination of the measuring direction and of an up/down (forward/backward) counter which counts with the appropriate sign the pulses generated by the direction discriminator. The evaluating circuit Z, which is connected to a control and/or display unit A', can include an interpolation arrangement for the formation of interpolation values within a single signal period P of the graduation 14, as described in German patent application DE-OS No. 27 29 697. Such interpolation can also be made by determining the phase angle $\phi = \arctan U_a/U_b$ within a graduation period P of the graduation 14 by means of a subdivision network (as described above).

Figure 7:
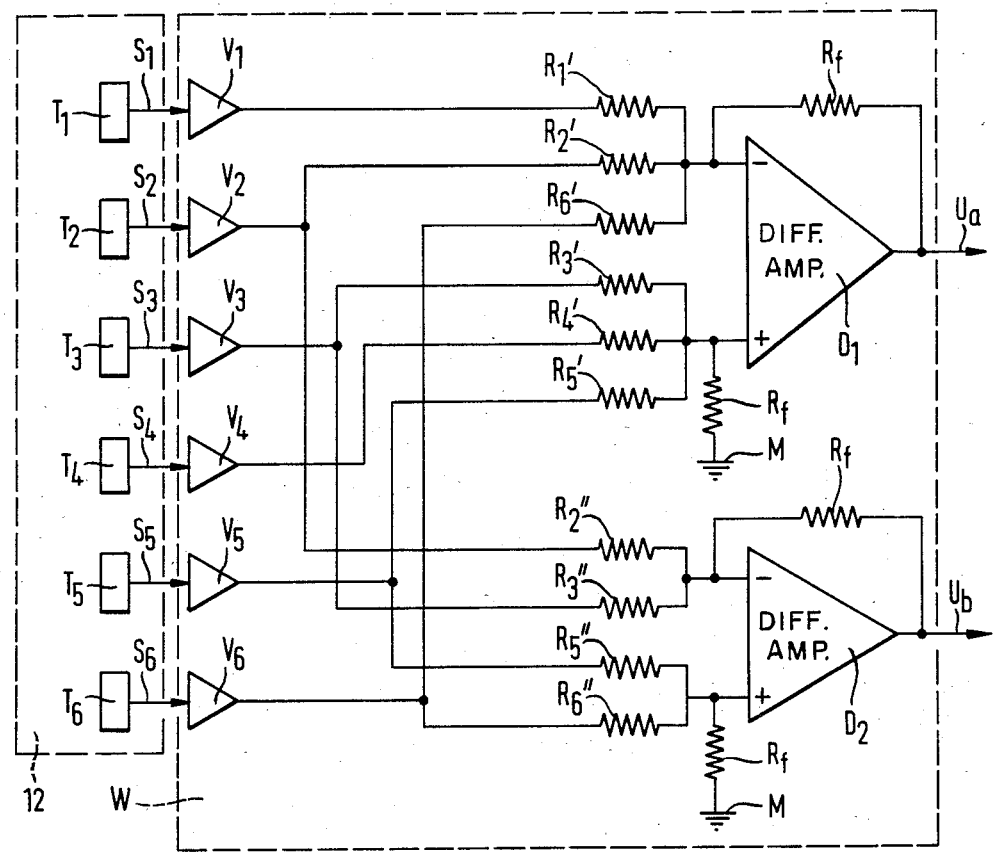
FIG. 7 is a schematic representation of a circuit suitable for use in the embodiment of FIG. 6.

FIG. 7 shows a more detailed representation of a circuit suitable for use in implementing the evaluating arrangement of FIG. 6. In the evaluating arrangement W of FIG. 7, the analog signals $S_1-S_6$ of the scanning elements $T_1-T_6$ of the scanning unit 12 are applied as inputs to respective ones of the amplifiers $V_1-V_6$. The outputs of these amplifiers $V_1-V_6$ are applied as shown in FIG. 7 via resistors $R_1'-R_6', R_2'', R_3'', R_5''$, and $R_6''$ to the two inputs of two differential amplifiers $D_1, D_2$. The outputs of the differential amplifiers $D_1, D_2$ are fed back via equal resistance resistors $R_f$ to their inverting inputs, and the noninverting inputs of the differential amplifiers $D_1, D_2$ are connected to ground M via respective resistors of the same resistance $R_f$. The amplified analog signals $S_1, S_2, S_6$ are applied via the resistors $R_1', R_2', R_6'$ to the inverting input of the differential amplifier $D_1$, and the amplified analog signals $S_3, S_4, S_5$ are applied via the resistors $R_3, R_4, R_5$ to the noninverting input of the differential amplifier $D_1$. The amplified analog signals $S_2, S_3$ are applied via the resistors $R_2'', R_3''$ to the inverting input of the differential amplifier $D_2$, and the amplified analog signals $S_5, S_6$ are applied via the resistors $R_5'', R_6''$ to the noninverting input of the differential amplifier $D_2$.

The resistors $R_n', R_n''$ cooperate with the resistors $R_f$ to bring about a multiplication of the analog signals $S_n$ by the multiplicative factors $\cos(\pi(n-1)/3)$ and $\sin(\pi(n-1)/3)$. Exemplary values for the resistance ratios $R_f/R_n'$ and $R_f/R_n''$ for the analog signals $S_n$ are presented in the following table:

TABLE 1

| $S_n$ | $\cos \pi (n-1)/3$ | $R_f/R_n'$ | $\sin \pi (n-1)/3$ | $R_f/R_n''$ |
|---|---|---|---|---|
| $S_1$ | 1 | 1 | 0 | 0 |
| $S_2$ | 0.5 | 0.5 | 0.87 | 0.87 |
| $S_3$ | −0.5 | 0.5 | 0.87 | 0.87 |
| $S_4$ | −1 | 1 | 0 | 0 |
| $S_5$ | −0.5 | 0.5 | −0.87 | 0.87 |
| $S_6$ | 0.5 | 0.5 | −0.87 | 0.87 |

The resistances $R_n$ corresponding to the negative cos and sin factors are connected to the noninverting inputs of the differential amplifiers $D_1, D_2$. The differential amplifier $D_1$ sums up the values $S_n \cdot \cos(\pi(n-1)/3)$, and the differential amplifier $D_2$ sums up the values $S_n \cdot \sin(\pi(n-1)/3)$. For this reason, the output of the differential amplifier $D_1$ is a harmonic-free periodic signal $U_a$ which takes the following form:

$$U_a = \sum_{n=1}^{6} S_n \cos \pi (n-1)/3. \quad \text{(Eq 4)}$$

The output of the differential amplifier $D_2$ is similarly a harmonic-free periodic analog signal $U_b$ which takes the following form:

$$U_b = \sum_{n=1}^{6} S_n \sin \pi (n-1)/3. \quad \text{(Eq 5)}$$

The same approaches as those described above in conjunction with FIGS. 5 through 7 can be used to evaluate the analog signals $S_n'$ shown in FIG. 3b.

Of course, it should be understood that a wide range of changes and modifications to the preferred embodiments described above will be apparent to those skilled in the art. For example, the present invention is readily adapted for use in inductive and capacitive measuring systems. Furthermore, this invention is well suited for use in the scanning of incremental scales, for example the finest, highest resolution incremental scale of an absolute measuring system. It is therefore intended that the foregoing detailed description be regarded as illustrative rather than limiting, and that it be understood that it is the following claims, including all equivalents, which are intended to define the scope of this invention.

I claim:

1. A method for generating harmonic-free periodic signals in an incremental or absolute measuring system comprising a scale which defines a graduation having a period P and a scanning unit which generates at least one scanning signal and scans the scale, said method comprising the following steps:

determining a band width N characteristic of the at least one scanning signal;
 providing at least 2N scanning elements in the scanning unit to scan the period P of the graduation, each of which generates a respective scanning signal $S_n$ in response thereto;
 performing a Fourier analysis on the scanning signals to determine at least a pair of Fourier coefficients $a_1, b_1$; $U_a, U_b$ . . . characteristic of a lowest frequency Fourier component of the at least one scanning signal; and
 determining by means of an evaluation unit the position of the scanning unit with respect to the scale from an evaluation of the at least a pair of Fourier coefficients $a_1, b_1$; $U_a, U_b$ . . . as harmonic-free periodic signals.

2. The method of claim 1 wherein the performing step comprises the step of digitizing the scanning signals and computationally determining the at least a pair of Fourier coefficients $a_1, b_1$; $U_a, U_b$ . . . from the digitized scanning signals; and wherein the evaluating step comprises the step of determining a phase position $\phi$ within a period P of the graduation as an arctangent function of a ratio of the at least a pair of Fourier coefficients $a_1, b_1$; $U_a, U_b$ . . . .

3. The invention of claim 1 wherein the performing step comprises the following steps:

multiplying each of the scanning signals $S_n$ by a factor $\cos(\pi(n-1)/N)$ to generate a plurality of first multiplied scanning signals;
 summing the first multiplied scanning signals to generate a first analog signal $U_a$;
 multiplying the scanning signals $S_n$ by a factor $\sin(\pi(n-1)/N)$ to generate a plurality of second multiplied scanning signals;
 summing the second multiplied scanning signals to generate a second analog signal $U_b$; and
 wherein the evaluating step comprises the step of determining a phase position $\phi$ within a graduation period P of the graduation from the harmonic-free free periodic analog signals $U_a, U_b$.

4. In a position measuring system comprising a measuring scale which comprises a periodic graduation and a scanning unit adapted to scan the measuring scale, the improvement comprising:

at least 2N scanning elements, each included in the scanning unit to scan the periodic graduation and to generate a respective periodic scanning signal in response thereto, each of said scanning signals including a fundamental component and (N-1) harmonic components;
 means for performing a Fourier analysis on the scanning signals to determine at least a pair of Fourier coefficients $a_1, b_1$; $U_a, U_b$ . . . characteristic of the fundamental component of the scanning signals; and
 means for evaluating the at least a pair of Fourier coefficients $a_1, b_1$; $U_a, U_b$ . . . to determine the position of the scanning unit with respect to the measuring scale.

5. The invention of claim 4 wherein the performing means comprises:

means for digitizing the scanning signals; and
 a computer, responsive to the digitized scanning signals, for computationally determining the at least a pair of Fourier $a_1, b_1$; $U_a, U_b$ . . . coefficients; and
 wherein the evaluating means comprises means for determining a phase position $\phi$ as an arctangent function of a ratio of the at least a pair of Fourier coefficients $a_1, b_1$; $U_a, U_b$ . . . .

6. The invention of claim 4 wherein the scanning signals are designated $S_1 \ldots S_n \ldots S_{2N}$, and wherein the performing means comprises:
  means for multiplying each of scanning signals $S_n$ by a factor $\cos(\pi(n-1)/N)$ to generate respective first multiplied scanning signals;
  means for summing the first multiplied scanning signals to generate a first analog signal $U_a$;
  means for multiplying each of the scanning signals $S_n$ by a factor $\sin(\pi(n-1)/N)$ to generate respective second multiplied scanning signals;
  means for summing the second multiplied scanning signals to generate a second analog signal $U_b$; and wherein the evaluating means comprises means for determining a phase position within a period of the graduation $\phi$ according to the relationship $\phi = \arctan(U_a/U_b)$.

7. The invention of claim 4 further comprising:
  means for displaying the position determined by the evaluating means.

8. The invention of claim 4 wherein the graduation defines a period P; wherein each of the scanning elements defines a width B along a measuring direction; wherein the width B is less than $P/2N$; and wherein the scanning elements are arranged in the scanning unit at a spacing of $P/2N + zP$, wherein $z = 0, 1, 2, \ldots$, respectively.

9. The invention of claim 4 wherein the graduation defines a period P; wherein each of the scanning elements defines a width B along a measuring direction; wherein the width B is greater than the period P; wherein each of the scanning elements defines alternating signal active zones and signal inactive zones; and wherein the scanning elements are arranged in the scanning unit at a spacing of $B + zP + P/2N$, where $z = 0, 1, 2, \ldots$, respectively.

10. The invention of claim 4 wherein the evaluating means comprises:
  means for digitizing each of the scanning signals;
  a computer; and
  means for applying the digitized scanning signals as inputs to the computer.

11. The invention of claim 4 wherein the evaluating means comprises:
  a plurality of amplifiers, responsive to the scanning signals, for generating a plurality of amplified scanning signals;
  a plurality of differential amplifiers; and
  means for applying the amplified scanning signals via a plurality of resistors as input signals to the plurality of differential amplifiers.

12. The invention of claim 4 wherein the evaluating means comprises:
  a direction discriminator responsive to the at least a pair of Fourier coefficients $a_1$, $b_1$; $U_a$, $U_b \ldots$; and
  an up-down counter coupled to the discriminator.

13. The invention of claim 4 wherein the evaluating means comprises:
  means for generating interpolation values within a signal period of the graduation.

* * * * *

UNITED STATES PATENT AND TRADEMARK OFFICE
CERTIFICATE OF CORRECTION

PATENT NO.   : 4,595,991
DATED        : June 17, 1986
INVENTOR(S)  : Alfons Spies It is certified that error appears in the above-identified patent and that said Letters Patent is hereby corrected as shown below:

IN THE SECTION ENTITLED "[56] REFERENCES CITED"

In the subsection entitled "FOREIGN PATENT DOCUMENTS", please include the following:

1941731   11/73   Fed. Rep. of Germany
2729697   1/79    Fed. Rep. of Germany

IN THE CLAIMS

In Claim 1 (column 8, line 11), please delete "coeffients" and substitute therefor --coefficients--;

In Claim 3 (column 8, line 38), please delete the duplicate "free".

Signed and Sealed this

Twenty-fifth Day of October, 1988

Attest:

DONALD J. QUIGG

Attesting Officer

Commissioner of Patents and Trademarks